(12) United States Patent
Jung

(10) Patent No.: US 7,501,319 B2
(45) Date of Patent: Mar. 10, 2009

(54) MANUFACTURING A SEMICONDUCTOR DEVICE INCLUDING SIDEWALL FLOATING GATES

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 154 days.

(21) Appl. No.: 11/731,124

(22) Filed: Mar. 30, 2007

(65) Prior Publication Data

US 2007/0178632 A1   Aug. 2, 2007

Related U.S. Application Data

(62) Division of application No. 10/962,818, filed on Oct. 7, 2004, now Pat. No. 7,217,973.

(30) Foreign Application Priority Data

Oct. 8, 2003   (KR) .................... 10-2003-0069782

(51) Int. Cl.
*H01L 21/8238* (2006.01)
(52) U.S. Cl. .................. 438/201; 438/211; 438/257; 257/E21.179
(58) Field of Classification Search .......... 438/201, 438/211, 257, 261, 593; 257/E21.179, E21.422, 257/E21.68
See application file for complete search history.

(56) References Cited

U.S. PATENT DOCUMENTS

| | | | |
|---|---|---|---|
| 4,698,787 A | 10/1987 | Mukherjee et al. | |
| 5,358,885 A | 10/1994 | Oku et al. | |
| 6,093,945 A | 7/2000 | Yang | |
| 6,329,248 B1 | 12/2001 | Yang | |
| 6,635,533 B1 * | 10/2003 | Chang et al. | 438/259 |
| 6,724,029 B2 | 4/2004 | Hsu et al. | |
| 6,734,055 B1 | 5/2004 | Lin et al. | |
| 6,885,072 B1 | 4/2005 | Jeng | |
| 2004/0253787 A1 | 12/2004 | Lee et al. | |

OTHER PUBLICATIONS

Hiromasa Noda, Fumio Murai, and Shin'ichiro Kimura; Threshold Voltage Controlled 0.1-μm MOSFET Utilization Inversion Layer as Extreme Shallow Source/Drain; IEDM 93, pp. 123 to 126; Published in 1993, IEEE.
Stanley Wolf, Ph.D.; Polycides and Salicides of TiSi2, CoSi2, and NiSi; Silicon Processing for the VLSI Era, vol. 4: Deep-Submicron Process Technology; Copyright 2002, Chapter 13, pp. 603 to 638; Lattice Press, Sunset Beach, CA.

* cited by examiner

*Primary Examiner*—Hoai v Pham
(74) *Attorney, Agent, or Firm*—Andrew D. Fortney

(57) ABSTRACT

A semiconductor device and a fabricating method thereof are disclosed. The semiconductor device includes polysilicon gate electrodes, a gate oxide layer, sidewall floating gates, a block oxide layer, source/drain areas, and sidewall spacers. In addition, the method includes the steps of: forming a block dielectric layer and a sacrificial layer on a semiconductor substrate; forming trenches by etching the sacrificial layer; forming sidewall floating gates on lateral faces of the trenches; forming a block oxide layer on the sidewall floating gates; forming polysilicon gate electrodes by a patterning process; removing the sacrificial layer; forming source/drain areas by implanting impurity ions into the resulting structure; injecting carriers or electric charges into the sidewall floating gates; and forming spacers on lateral faces of the polysilicon gate electrodes and the sidewall floating gates.

16 Claims, 6 Drawing Sheets

MANUFACTURING A SEMICONDUCTOR DEVICE INCLUDING SIDEWALL FLOATING GATES

This application is a divisional of U.S. patent application Ser. No. 10/962,818, filed Oct. 7, 2004, now U.S. Pat. No. 7,217,973.

BACKGROUND OF THE INVENTION

1. Field of the Invention

The present disclosure relates to a semiconductor device and a fabricating method thereof and, more particularly, to nano-scale MOS transistors with virtual source/drain extension areas and a fabricating method thereof.

2. Background of the Related Art

A conventional ion implantation method for forming a source/drain area has several shortcomings. One of these shortcomings is that implanted impurity ions can be diffused into a channel area by a later thermal treatment. Due to such a shortcoming, if the length of a gate electrode is equal to or less than 0.06 μm, a source area and a drain area may be easily connected through impurities, therefore preventing the fabrication of a MOS transistor. Even if the length of the gate electrode is more than 0.06 μm, a short channel effect may seriously occur because the shallow depth of the source/drain area is hardly formed to be less than 10 nm. Thus, to make a nano-scale transistor (i.e., below 0.1 μm) with a source/drain extension area, a virtual source/drain extension structure employing sidewall gate electrodes is drawing attention as one of alternatives.

FIG. 1 is a cross-sectional view illustrating a structure of the MOS transistor having three gate electrodes according to "Threshold voltage controlled 0.1 MOSFET utilizing inversion layer as extreme shallow source/drain.", H. Noda et al., IEDM Tech. Dig., pages 123 to 126, published in 1993.

Referring to FIG. 1, an NMOS transistor comprises a main gate oxide layer 14 on a P-type silicon substrate 11, a polysilicon main gate electrode 17, an oxide layer 16, a gate oxide layer 15, a source area 12 and a drain area 13, and sidewall gates 18. The polysilicon main gate electrode 17 and sidewall gates 18 adjacent to the main gate electrode 17 are doped with a high concentration of N-type impurity ions.

The oxide layer 16 for insulation is formed between the gate electrode 17 and the sidewall gates 18. The gate oxide layer 15 is positioned between the sidewall gates 18 and the P-type silicon substrate 11.

When a constant voltage is applied to the sidewall gates 18, inversion layers are generated under the sidewall gates 18. The inversion layers function as source/drain extension areas in a MOS transistor. Therefore, when a voltage is applied to the main gate electrode 17, a channel will be created and current then flows between the source 12 and the drain 13.

If highly concentrated N+ ions are implanted in the polysilicon gate electrode, the difference of the work function may be about −1.0V, and the Fermi potential may be fixed between 0.4V and 0.45V. Thus, to control a threshold voltage, two methods are typically employed. One method is to adjust the amount of electric charges in a depletion area by tuning the concentration of a silicon substrate. The other is to implant N-type or P-type impurity ions into the silicon substrate.

For example, if the dopant concentration of the substrate is $1.0 \times 10^{17}$ ions/cm$^3$, a highly doped N+ polysilicon gate is used, the thickness of the gate oxide layer is approximately 50 Å, and no impurity ion is implanted into the surface of the substrate, the threshold voltage of a long channel transistor may be about 0.1V, and the threshold voltage of the short channel transistor may be less than 0.1V. Therefore, if a much higher voltage (e.g., 2V to 3V) than the threshold voltage is applied to the sidewall gates, a sufficient amount or depth of the inversion layers below the sidewall floating gates will be created to form source/drain extension areas.

Under the above-mentioned condition, the threshold voltage can be increased by implanting P-type impurity ions into the surface of the substrate and decreased by implanting N-type impurity ions into the surface of the substrate. Once they are implanted, the impurity ions may be diffused by a later thermal treatment. Moreover, even if the N-type impurity ions are implanted into the surface of the substrate, the threshold voltage may not fall below −1 to −2V. Therefore, a voltage has to be applied to the sidewall gates to create the virtual source/drain extension area.

However, applying a constant voltage to the sidewall gates has several problems, in that: (1) a contact should be formed on the sidewall gates; (2) the implanted ions for controlling the threshold voltage of the sidewall gates may be diffused by a later thermal treatment and affect the threshold voltage of the main gate electrode; (3) parasitic capacitance may be generated between the sidewall gates and the main gate electrode, between the sidewall gates and a body, and between the sidewall gates and the source/drain area, thereby decreasing propagation velocity of the voltage applied to the sidewall gates and thus degrading the characteristics of the transistor; (4) because a constant voltage should continue to be applied to the sidewall gates, additional leakage current may be generated, leading to an increase in power consumption; and (5) an insulating layer between the sidewall gates and the main gate electrode may deteriorate.

U.S. Pat. No. 4,698,787, to Mukherjee et al., discloses an electrically erasable programmable memory device which is programmable in the manner of an EPROM and erasable in the manner of an EEPROM. A dielectric layer between the control gate and the floating gate having a high dielectric constant is provided. A thin, uniform gate dielectric layer which demonstrates minimal trapping is provided.

U.S. Pat. No. 5,358,885, to Oku et al., discloses a method of producing a field effect transistor which can reduce the space between the over-hanging portion of a T-shaped gate electrode and the source electrode and increases the gate-to-source capacitance.

U.S. Pat. No. 6,329,248, to Yang et al., discloses a process for making split-gate semiconductor flash memory which contains an outwardly-diverging control gate stacked on, but separated from, a pair of opposing floating gates via an interpoly dielectric layer. The split-gate flash memory eliminates the over-erase problem experienced with the self-aligned ETOX flash memory cells, while allowing its cell dimension to be maintained, using the conventional photolithography technique.

SUMMARY OF INVENTION

Accordingly, the present invention is directed to a semiconductor device and a fabricating method thereof that obviates one or more problems due to limitations and disadvantages of the related art.

The object of the present invention is to provide a reliable semiconductor device and a fabricating method thereof which can prevent a short channel effect in a nano-scale transistor by forming an extremely thin source/drain extension area.

Another object is to avoid the juncture of the source and drain in a nano-scale gate electrode by creating a virtual source/drain extension area.

To achieve these objects and other advantages, in accordance with the purpose(s) of the invention as embodied and broadly described herein, the present invention provides a semiconductor device comprising: polysilicon gate electrodes on a semiconductor substrate; a gate oxide layer between the polysilicon gate electrodes and the semiconductor substrate; sidewall floating gates under side portions of the polysilicon gate electrodes; a block dielectric layer between the sidewall floating gates and the semiconductor substrate; a block oxide layer between the polysilicon electrodes and the sidewall floating gates; source/drain areas in the substrate on each side of the gate electrodes; and sidewall spacers adjacent to the polysilicon gate electrodes and side wall floating gates. The polysilicon gate electrode may be a 'T' shaped gate electrode, which means that the upper part of the polysilicon gate electrode (i.e., farthest away from the substrate) is larger in width than the lower part of the polysilicon gate electrode (i.e., closest to the substrate).

In addition, a method for fabricating a semiconductor device according to the present invention comprises: forming a block dielectric layer and a sacrificial layer on a semiconductor substrate; forming trenches by etching the sacrificial layer; forming sidewall floating gates on the lateral faces of the trenches; forming a block oxide layer on the surface of the sidewall floating gates; forming polysilicon gate electrodes at least partly in the trenches by a patterning process; removing the sacrificial layer; forming source/drain areas by implanting impurity ions into the resulting structure; injecting carriers or electric charges into the sidewall floating gates; and forming spacers adjacent to the polysilicon gate electrodes and the sidewall floating gates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE PREFERRED EMBODIMENT

Reference will now be made in detail to the preferred embodiments of the present invention, examples of which are illustrated in the accompanying drawings.

FIGS. 2a through 2k are cross-sectional views illustrating an example method for fabricating MOS transistors with virtual source/drain extension areas in accordance with the present invention.

Figure 1:
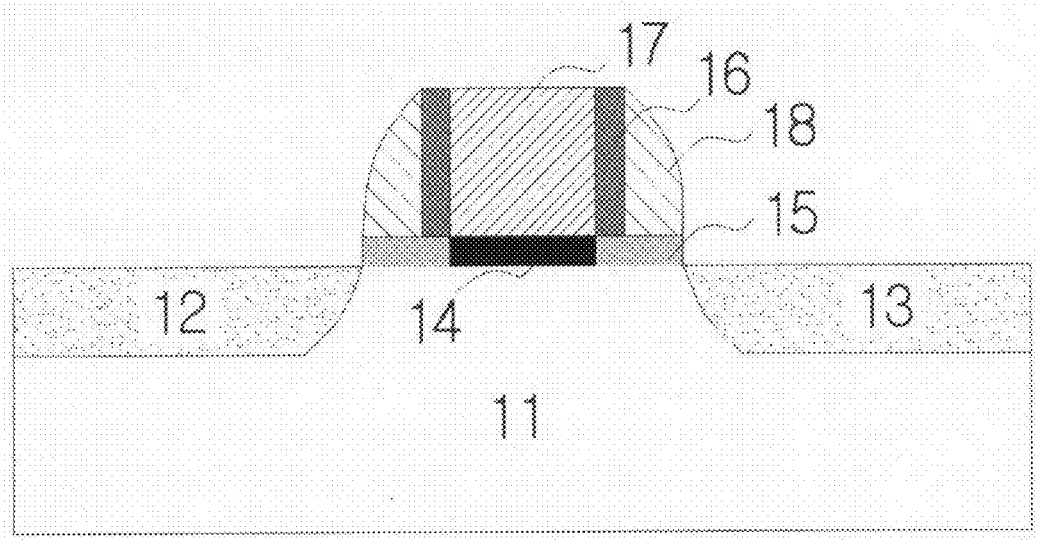
FIG. 1 is a cross-sectional view illustrating a conventional structure of the MOS transistor having three gate electrodes.
Figure 2A:
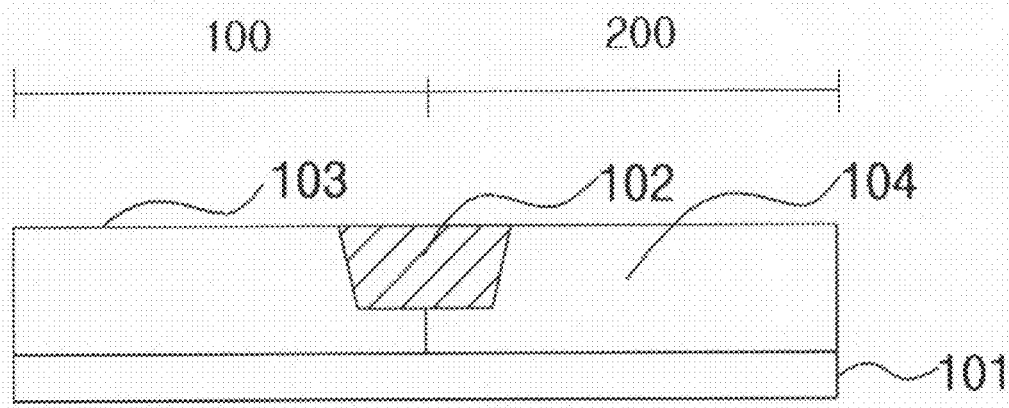
FIGS. 2a through 2k are cross-sectional views illustrating an example method for fabricating MOS transistors with virtual source/drain extension areas performed in accordance with the present invention.

FIG. 2a is a cross-sectional view illustrating a well formation process. A device isolation structure 102 is formed in a P-type substrate 101. The device isolation structure 102 electrically separates devices on the substrate. A photoresist layer is formed on the resulting structure, and a mask pattern is then formed by a photolithography process. With the mask pattern, a P-type well 103 is formed by implanting P-type impurity ions into a predetermined NMOS area 100. The mask pattern is then removed. With a photolithography process substantially identical to that for forming the P-type well 103 described above, an N-type well 104 is formed by implanting N-type impurity ions into the predetermined PMOS area 200.

Figure 2B:
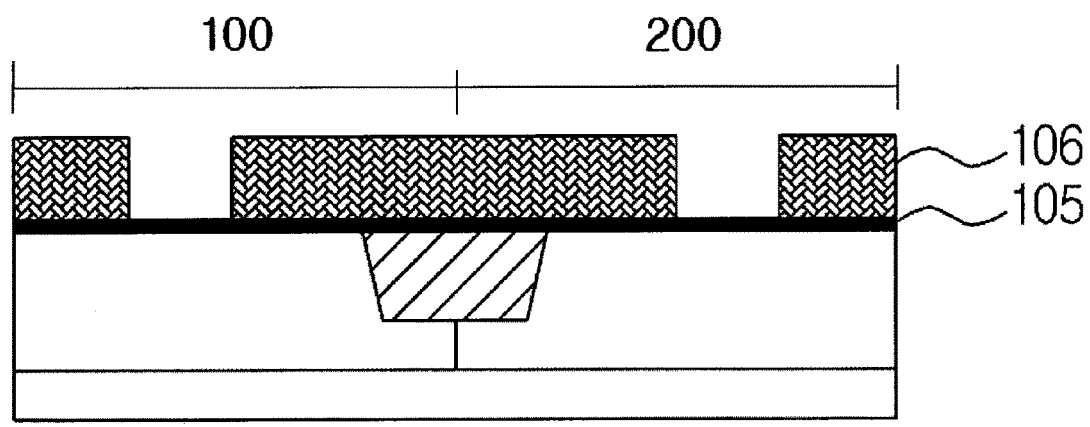

Referring to FIG. 2b, a block dielectric layer 105 is formed on the entire surface of the resulting structure. The block dielectric layer 105 may comprise a conventional oxide, nitride or oxynitride of silicon, and it may be formed through an oxidation process, LPCVD (Low Pressure Chemical Vapor Deposition) or HDP-CVD (High Density Plasma Chemical Vapor Deposition), as is known in the art. A sacrificial layer 106 is formed on the block dielectric layer 105. The sacrificial layer 106 preferably comprises an oxide or nitride of silicon, preferably a different material than block dielectric layer 105 (e.g., if sacrificial layer 106 consists essentially of silicon nitride, then block dielectric layer 105 may consist essentially of silicon oxide; if sacrificial layer 106 consists essentially of a CVD silicon oxide, then block dielectric layer 105 may consist essentially of thermally oxidized silicon oxide; etc.). Subsequently, trenches (e.g., for forming gate electrodes) are made by removing predetermined parts of the sacrificial layer 106 through a conventional patterning process.

Figure 2C:
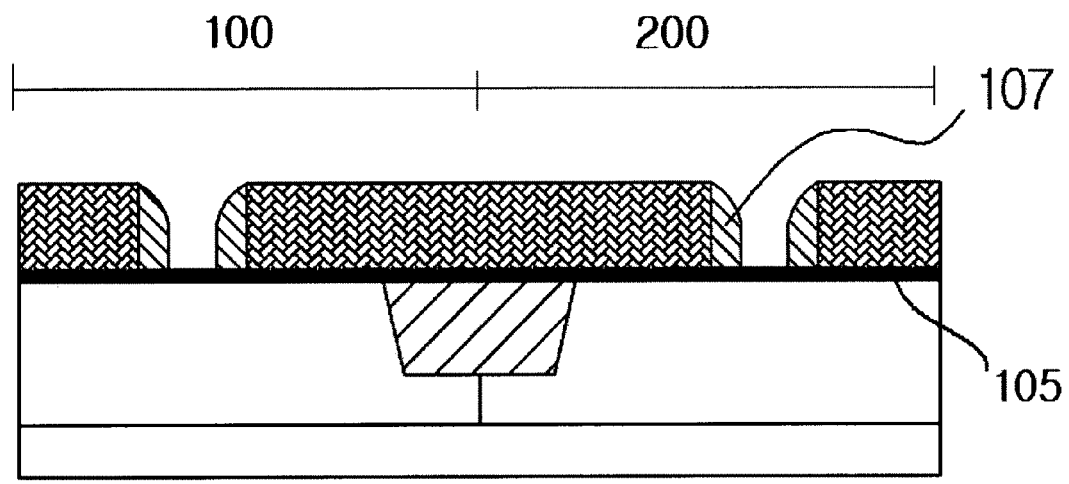

Referring to FIG. 2c, (poly)silicon or other material suitable for forming sidewall floating gates (e.g., metals such as aluminum, titanium, tungsten, etc.; alloys of such metals, such as Al—Cu, Al—Cu—Si, TiW, etc.; conductive compounds, such as titanium silicide, cobalt silicide, tungsten silicide, titanium nitride, tantalum nitride, etc.; and other suitable floating gate materials, such as silicon nitride) is deposited on the resulting structure including the trenches. (The term "(poly)silicon" refers to amorphous, partially amorphous or polycrystalline silicon, and includes material that is deposited as partially hydrogenated, amorphous silicon that is later converted to polycrystalline silicon [polysilicon] by thermal treatment or UV irradiation.) Next, sidewall floating gates 107 are formed by anisotropically etching the deposited floating gate material. Here, when used, the polysilicon is doped with a high concentration of N-type impurity ions. If the block dielectric layer 105 is unintentionally removed during the trench formation, an oxide layer should be formed again before the polysilicon is deposited. Alternatively, sacrificial layer 106 may be formed directly on substrate 103/104, and block dielectric 105 may be formed only in the trenches after the trenches are etched (typically by thermal oxidation), in which case the block dielectric layer 105 may also serve as the gate oxide. Thus, the steps of forming a block dielectric layer and a sacrificial layer do not necessarily mean that the layers must be formed in a particular order (unless otherwise indicated).

Figure 2D:
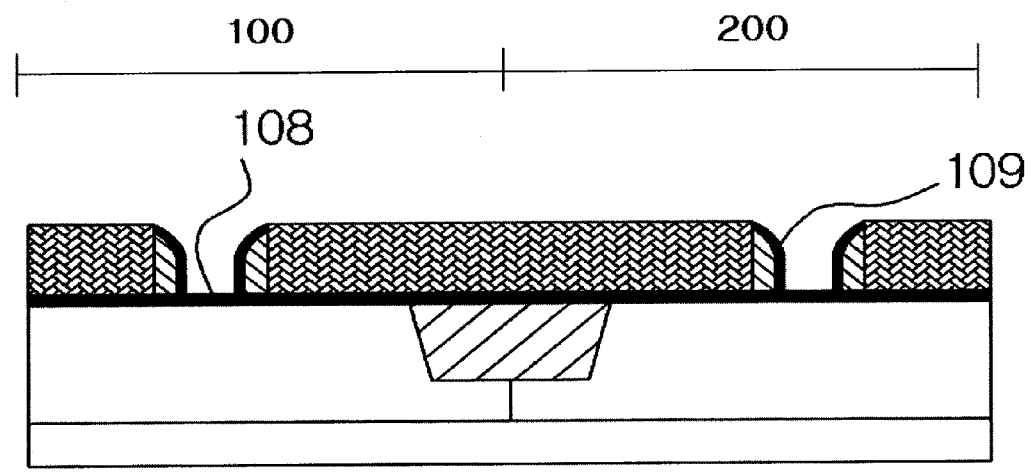

Referring to FIG. 2d, portions of the block dielectric layer 105 remaining in areas for forming gate electrodes may be removed. Subsequently, a gate oxide layer 108 may be formed on the portions of substrate 103/104 exposed by removing portion of the block dielectric layer 105. Simultaneously, a block oxide layer 109 may be formed on the sidewall floating gate 107. The gate oxide layer 108 and the block oxide layer 109 may be formed through an oxidation process, LPCVD (Low Pressure Chemical Vapor Deposition) or HDP-CVD (High Density Plasma Chemical Vapor Deposition). The oxidation process is most preferably employed. Alternatively, when block dielectric layer 105 has suitable characteristics (e.g., it is sufficiently thin and comprises a thermally grown oxide), it may serve as the gate oxide layer. In such a case, block dielectric layer 105 is not removed, and the gate oxide layer may also be between the sidewall floating gates 107 and the semiconductor substrate. Block dielectric layer 109 is preferably formed on sidewall floating gates 107 by oxidation in this alternative embodiment, although such oxidation may also thicken the portion of block dielectric layer 105 serving as the gate oxide layer.

Figure 2E:
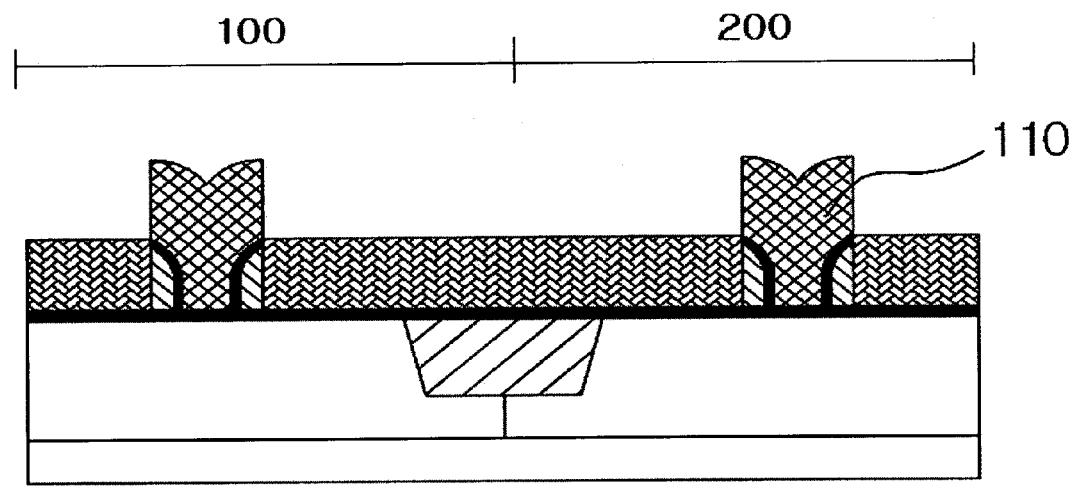

Referring to FIG. 2e, (poly)silicon is deposited on the resulting structure. Subsequently, polysilicon gates 110 are formed through a conventional patterning process. Polysilicon gates 110 may further comprise a conventional metal silicide layer.

Figure 2F:
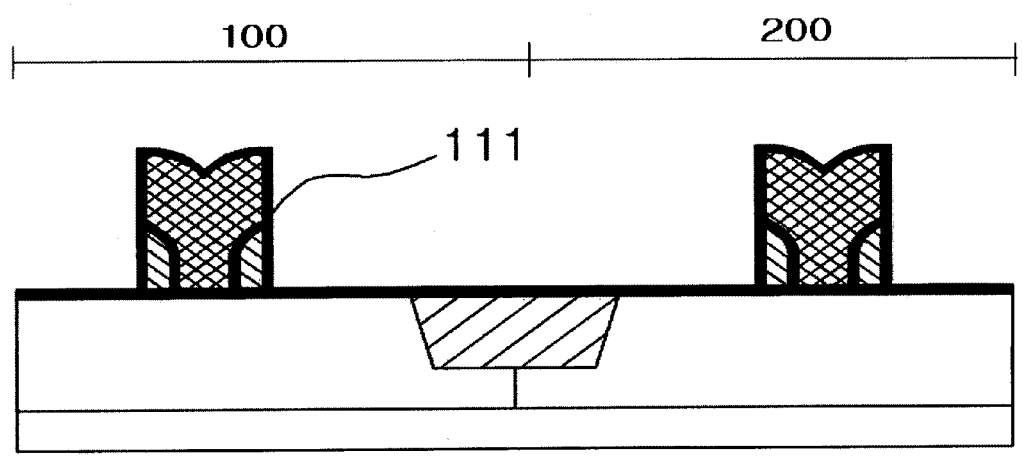

Referring to FIG. 2f, the sacrificial layer 106 is removed by an etching process. Subsequently, using a reoxidation process, an insulator (e.g., silicon oxide) layer 111 is then formed on the surface of both polysilicon gates 110 and sidewall floating gates 107. Alternatively, when sidewall floating gates 107 consist essentially of a material other than silicon, insulator layer 111 may be formed by a CVD process.

Figure 2G:
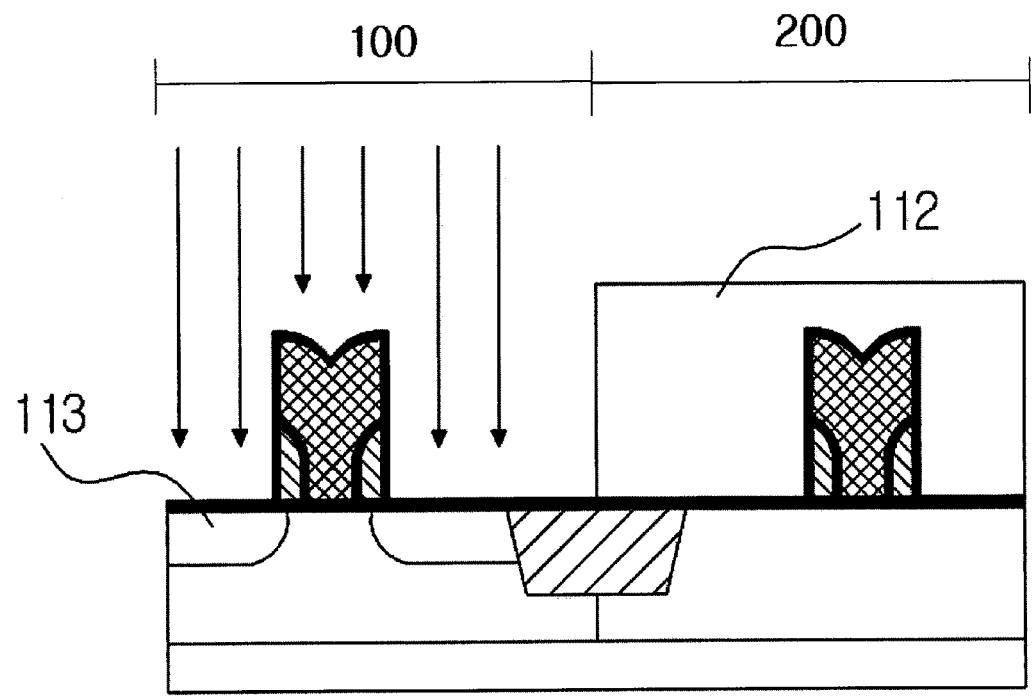

Referring to FIG. 2g, a mask pattern 112 made of photoresist is formed on the entire PMOS area 200. Subsequently, source/drain areas (e.g., source/drain terminal 113) are formed in the NMOS area 100 by implanting N-type impurity ions.

Figure 2H:
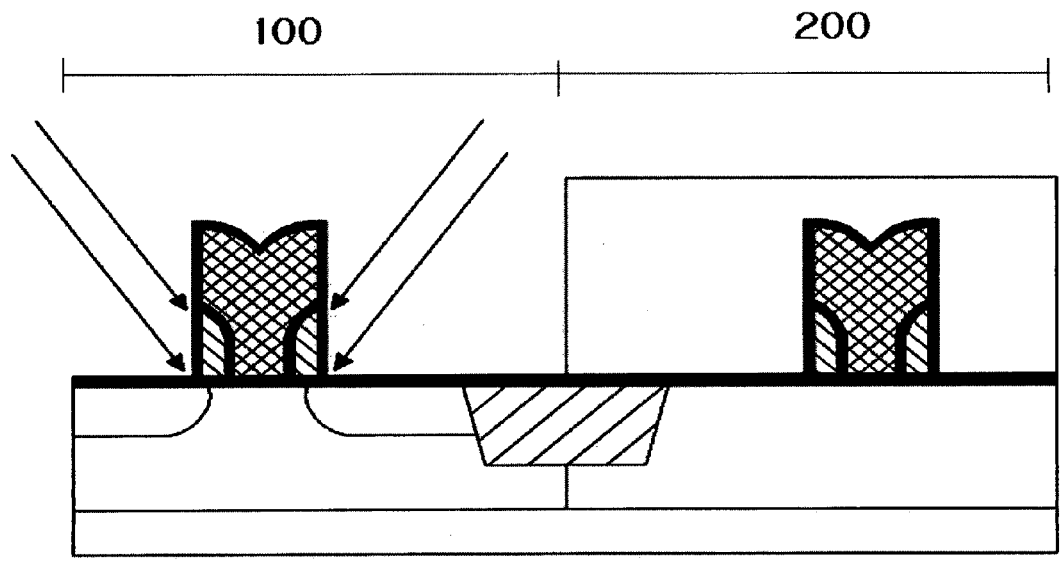
Figure 2I:
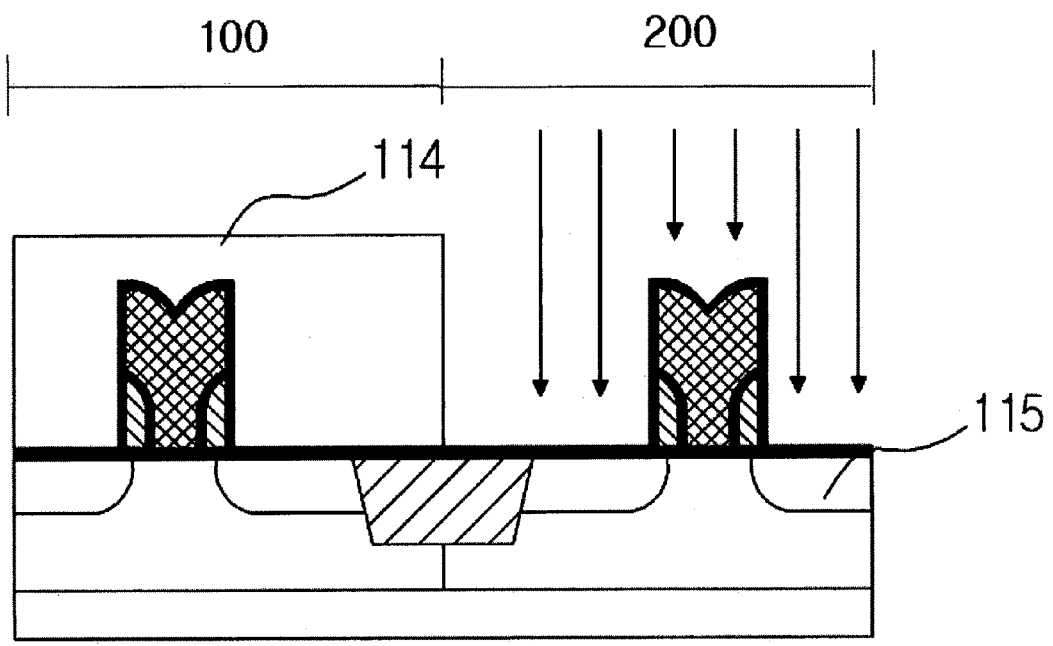

Referring to FIG. 2h, holes or positive electric charges are injected into the sidewall floating gates, which are positioned on the lateral faces of the NMOS transistor gate electrode. Thus, the threshold voltage of the sidewall floating gates is controlled at a predetermined, desired or required level. While the substrate 101 is rotated (e.g., four times by 90° each time), the holes or positive electric charges are injected at a predetermined angle. Because a virtual source/drain area can be created by the inversion layers under the sidewall floating gates without applying a bias to the sidewall floating gates, a contact for applying such a bias may not be necessary.

In addition, because the depth of the virtual source/drain area is approximately 5 Å, which is very shallow, a short channel effect can be prevented, even in a nano-scale transistor. Moreover, because an impurity implantation process for decreasing the threshold voltage of the sidewall floating gates is not required, the variance of the threshold voltage of the sidewall floating gates, which is generated from the ion implantation, can be avoided.

Figure 2J:
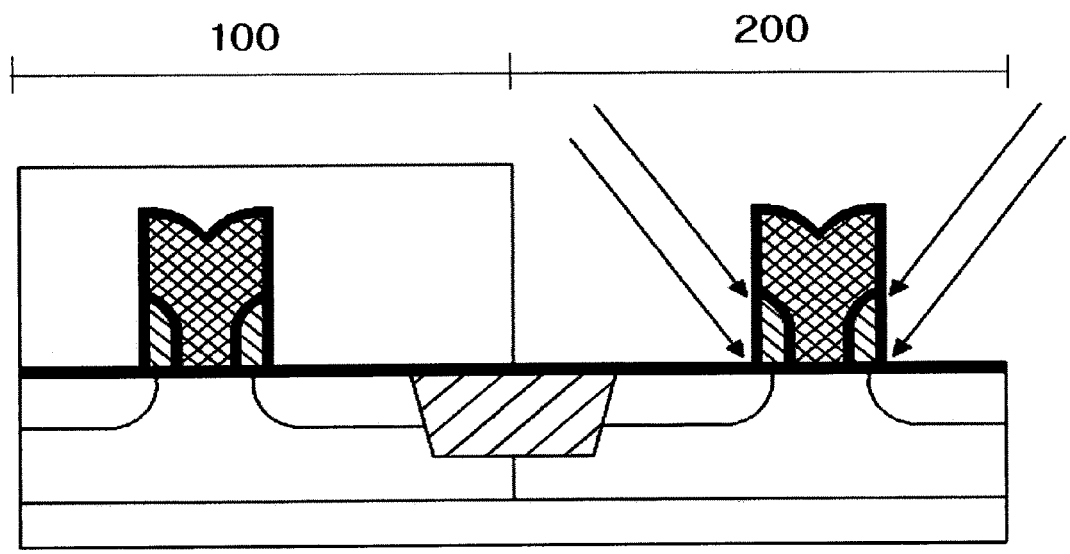

Referring to FIG. 2j, the mask pattern 112 on the PMOS area 200 is removed. Subsequently, a mask pattern 114 made of photoresist is formed on the NMOS area 100. Source/drain areas (e.g., source/drain terminal 115) are then formed on the PMOS area 200 by implanting P-type impurity ions. Next, negative charges or electrons are injected into the sidewall floating gates which are positioned on the either lateral faces of the PMOS transistor gate electrode. While the substrate 101 is rotated (e.g., four times by 90° each time), negative charges or electrons are injected at a predetermined angle. Subsequently, the mask pattern 114 on the PMOS area 200 is removed.

Figure 2K:
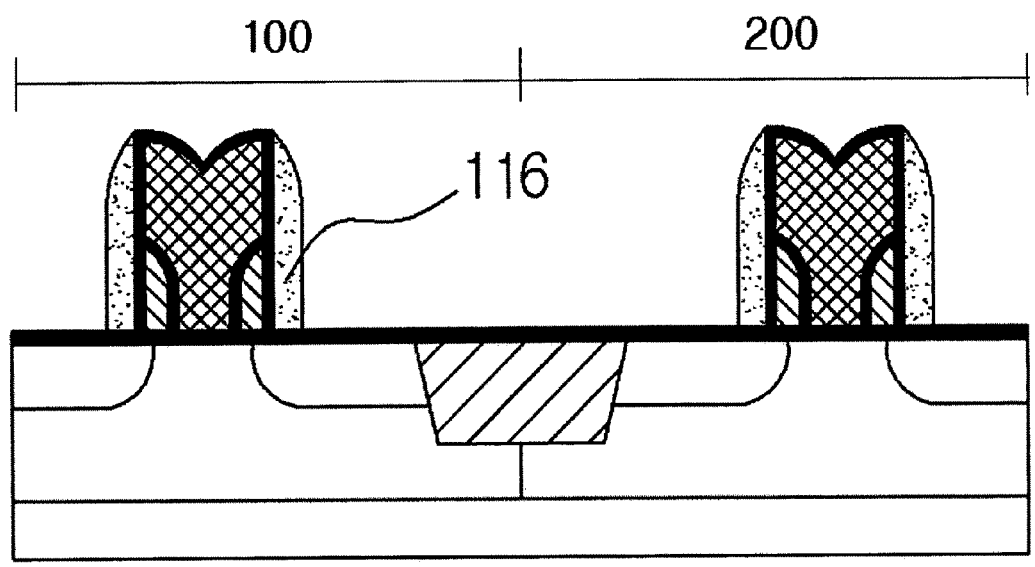

Referring to FIG. 2k, sidewall spacers 116 are formed adjacent to (e.g., on the oxide grown from) each exposed lateral face of the sidewall floating gates. The sidewall spacers preferably comprise a nitride (e.g., silicon nitride).

Next, a salicide layer and interconnects (metal wire) are formed on the resulting structure by later conventional, predetermined processes.

The present invention can adjust the threshold voltage of the sidewall floating gates at a required voltage (or less) by decreasing a flat band voltage and by injecting holes/electrons or electric charges into the sidewall floating gates (e.g., comprising heavily doped polysilicon). In detail, it is believed that the flat band voltage is decreased by locking up the injected holes/electrons or charges into potential wells between the sidewall floating gates and the block oxide layer.

For example, if the sidewall floating gates comprise heavily $N^+$-doped polysilicon, the dopant concentration of the silicon substrate is $1.0 \times 10^{17}$ ions/cm$^3$, the thickness of the oxide layer is 90 Å, holes or positive charges of $2.0 \times 10^{-6}$ C/cm$^3$ are injected into the sidewall floating gates, and the N or P type impurity ions are not implanted into the main substrate, the threshold voltage of a long channel NMOS transistor may be approximately −5V. If the holes or positive charges are injected into the potential wells of the sidewall floating gates, an extremely low threshold voltage (e.g., below 0V) may be obtained. Therefore, inversion layers are formed under the sidewall floating gates without additional biases, creating a virtual source/drain extension area.

The threshold voltage can be adjusted by controlling the amount or concentration of the holes or positive charge injected into the potential wells of the sidewall floating gates. In other words, the threshold voltage of the sidewall floating gates can be decreased by increasing the injected amount of holes or the positive charges, therefore increasing the depth or amount of the inversion layers. Thus, the parasitic resistance of the virtual source/drain extension area is decreased. As a result, a nano-scale transistor having high performance and high operating current can be manufactured.

In contrast, the threshold voltage of the sidewall floating gates can be increased by decreasing the injected amount or concentration of holes or positive charges, therefore decreasing the depth or amount of the inversion layers. Thus, the parasitic resistance of the virtual source/drain extension areas is increased. As a result, a nano-scale transistor with low leakage current can be manufactured. In addition, it is believed that the increase of the threshold voltage due to the amount of the electric charges of a depletion layer can be decreased by employing high dielectric constant materials or by decreasing the thickness of the block dielectric layer.

A transistor fabricated pursuant to the process illustrated in FIGS. 2a through 2k can dynamically adjust the depth or amount of the inversion layers depending on the ON/OFF state of the transistor. In detail, if a voltage is applied to the polysilicon gate electrode, a predetermined voltage may be generated in the sidewall floating gates due to the coupling ratio between the block dielectric and block oxide layers. If the coupling ratio is equal to or more than 0.5, the voltage generated in the sidewall floating gates may become 0.5 times (or more) of the voltage applied to the polysilicon gate electrode. Here, the required minimum coupling ratio (e.g., 0.5) can be obtained by: (1) forming the block oxide layer thinner than the block dielectric layer; or (2) making the block oxide layer of a material with a higher dielectric constant than that of the block dielectric layer. Because the voltage generated in the sidewall floating gates heavily increases the depth of the inversion layers under the sidewall floating gates, the parasitic resistance of the virtual source/drain extension area is greatly decreased. Therefore, if the transistor is in an 'On' state, a high amount of current may flow. In contrast, if the transistor is in an 'Off' state, a small amount of current may flow due to the increase of the parasitic resistance of the virtual source/drain extension area.

Accordingly, a semiconductor device and a fabricating method thereof can decrease the threshold voltage of the sidewall floating gates (e.g., at a predetermined and/or required level) by injecting electrons/holes or electric charges into the sidewall floating gates (which may comprise highly doped polysilicon). Therefore, without applying a bias to the sidewall floating gates, inversion layers are formed under the sidewall floating gates, creating the virtual source/drain extension areas. Consequently, because the formation of contacts for applying such biases can be avoided, a manufacturing process is simplified, and the space occupied by transistors may be reduced.

Moreover, because the virtual source/drain extension areas under the sidewall floating gates is extremely thin (e.g., 5 Å), the short channel effect can be prevented, even in a nano-scale polysilicon gate electrode. Thus, reliable MOS transistors having (1) high performance and high operating current, and/or (2) low leakage current can be simultaneously fabricated.

The foregoing embodiments are merely exemplary and are not to be construed as limiting the present invention. The present teachings can be readily applied to other types of devices. The description of the present invention is intended to be illustrative, and not to limit the scope of the claims. Many alternatives, modifications, and variations will be apparent to those skilled in the art.

What is claimed is:

1. A method to fabricate a semiconductor device, comprising:
    forming a block dielectric layer and a sacrificial layer on a semiconductor substrate; forming trenches by etching the sacrificial layer;
    forming sidewall floating gates on lateral faces of the trenches;
    forming a block oxide layer on the sidewall floating gates;
    forming polysilicon gate electrodes on the resulting structure using a patterning process;
    removing the sacrificial layer;
    forming source/drain areas by implanting impurity ions into the resulting structure; injecting carriers or electric charges into the sidewall floating gates; and
    forming sidewall spacers adjacent to the polysilicon gate electrodes and the sidewall floating gates,
    wherein the sidewall floating gates have an amount or concentration of electrons or holes under side portions of the polysilicon gate electrodes sufficient to adjust a threshold voltage of the device and form an inversion layer in the substrate under the sidewall floating gates without application of a bias to the sidewall floating gates.

2. The method as defined by claim 1, further comprising forming an insulator layer on the surface of the polysilicon gate electrodes and the sidewall floating gates, after removing the sacrificial layer but before injecting carriers or electric charges into the sidewall floating gates.

3. The method as defined by claim 1, further comprising, before forming the polysilicon gate electrodes, the steps of removing the block dielectric layer from areas in the trenches exposed after forming the sidewall floating gates, and forming a gate oxide layer.

4. The method as defined by claim 1, comprising forming the gate oxide layer and the block oxide layer simultaneously.

5. The method as defined by claim 1, wherein the gate oxide layer and the second block oxide layer are formed by an oxidation process, LPCVD or HDP-CVD.

6. The method as defined by claim 1, wherein the sacrificial layer comprises a material selected from the group consisting of oxides, oxynitrides and nitrides.

7. The method as defined by claim 1, wherein the sidewall floating gates are formed by anisotropic etching.

8. The method as defined by claim 1, wherein the sidewall floating gates comprise heavily doped polysilicon.

9. The method as defined by claim 1, wherein the carriers or electric charges injected into an NMOS transistor comprise holes or negative charges.

10. The method as defined by claim 1, wherein the carriers or electric charges injected into a PMOS transistor comprise electrons or positive charges.

11. The method as defined by claim 10, wherein positive charges of $2.0 \times 10^{-6}$ C/cm$^3$ or more are injected into the sidewall floating gates.

12. The method as defined by claim 1, wherein the carriers or electric charges are injected at a predetermined angle while rotating the semiconductor substrate.

13. The method as defined by claim 1, wherein virtual source/drain extension areas are formed under the sidewall floating gates.

14. The method as defined by claim 13, wherein the virtual source/drain extension areas is 5 Å and less.

15. The method as defined by claim 1, wherein the source/drain extension areas are adjusted by controlling the coupling ratio between the block dielectric layer and the block oxide layer.

16. The method as defined by claim 1, wherein a coupling ratio between the block dielectric layer and the block oxide is 0.5 or more.

* * * * *